US008809998B2

(12) United States Patent
Camillo-Castillo et al.

(10) Patent No.: US 8,809,998 B2
(45) Date of Patent: Aug. 19, 2014

(54) SEMICONDUCTOR DEVICE INCLUDING IN WAFER INDUCTORS, RELATED METHOD AND DESIGN STRUCTURE

(75) Inventors: Renata A. Camillo-Castillo, Essex Junction, VT (US); John J. Ellis-Monaghan, Grand Isle, VT (US); Robert M. Rassel, Colchester, VT (US); Daniel S. Vanslette, Faifax, VT (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 13/282,123

(22) Filed: Oct. 26, 2011

(65) Prior Publication Data

US 2013/0105941 A1    May 2, 2013

(51) Int. Cl.
*H01L 21/76* (2006.01)

(52) U.S. Cl.
USPC ........................................ 257/531

(58) Field of Classification Search
CPC .......... H01L 23/48; H01L 21/02; H01L 28/10
USPC ............. 257/531, 528, 494, 379, 516, 904, 7, 257/212, 93, 337, 265, 357, 334, 368, 427, 257/491, 446, 663, 713, 758, 922, 929; 438/117, 42, 243, 270
See application file for complete search history.

(56) References Cited

U.S. PATENT DOCUMENTS

| | | | | |
|---|---|---|---|---|
| 7,335,580 | B1 * | 2/2008 | Buerger et al. | 438/584 |
| 7,851,361 | B2 * | 12/2010 | Burke et al. | 438/690 |
| 8,143,952 | B2 * | 3/2012 | Kim et al. | 330/307 |
| 2004/0094822 | A1 * | 5/2004 | Yu | 257/531 |
| 2004/0195651 | A1 | 10/2004 | Zhang et al. | |
| 2009/0283854 | A1 | 11/2009 | Levy et al. | |
| 2010/0013073 | A1 | 1/2010 | Andry et al. | |

FOREIGN PATENT DOCUMENTS

JP    2009128342    * 11/2009

OTHER PUBLICATIONS

Zhang et al., "3D TSV Transformer Design for DC-DC/AC-DC Converter," 2010, pp. 1653-1656.
Zhang et al., "Design and Characterization of SOI Spiral Coil RF Monolithic Transformers," 2004, pp. 183-185.

* cited by examiner

*Primary Examiner* — Matthew Landau
*Assistant Examiner* — Damon Hillman
(74) *Attorney, Agent, or Firm* — Anthony J. Canale; Hoffman Warnick LLC

(57) ABSTRACT

An Integrated Circuit (IC) and a method of making the same. In one embodiment, the IC includes: a substrate; a first set of trenches formed in a first surface of the substrate; a second set of trenches formed in a second surface of the substrate; and at least one through silicon via connecting the first set of trenches and the second set of trenches.

19 Claims, 12 Drawing Sheets

SEMICONDUCTOR DEVICE INCLUDING IN WAFER INDUCTORS, RELATED METHOD AND DESIGN STRUCTURE

FIELD OF THE INVENTION

The disclosure relates generally to integrated circuit (IC) chips and fabrication, and more particularly, to a semiconductor device including a set of inductors and/or transformers in a wafer, a related method and design structure.

BACKGROUND

In integrated circuit (IC) design, inductors and transformers are key components which are commonly called for and used by designers. Standard IC chip fabrication uses external components and Back End Of Line (BEOL) inductors to form transformers in and upon ICs. These components and transformers are used by designers to effect inductance passives, and to perform impedance matching in ICs. These external components and BEOL inductors are added onto the wafer as part of the manufacturing process. This use of off-chip discrete elements to provide inductors and transformers in current IC chip fabrication technology limits chip design options and increases circuit size, circuit complexity, and the number of external components used in electronic circuits.

In some ICs, monolithic on-chip inductors and transformers may be incorporated into the design to decrease the complexity and size of the IC. However, the on-chip inductors and transformers which must be used on the chip to meet the design demands, often result in large and restrictive patterns on the IC. These large monolithic components may limit design flexibility and consume a large amount of IC area.

BRIEF SUMMARY

A first aspect of the disclosure provides a substrate; a first set of trenches formed in a first surface of the substrate; a second set of trenches formed in a second surface of the substrate; and at least one through silicon via connecting the first set of trenches and the second set of trenches.

A second aspect of the disclosure provides a method of forming a semiconductor device including: forming a first set of trenches in a substrate; forming a first set of through silicon vias (TSVs) in the substrate; performing back end of line (BEOL) processing; forming a second set of trenches in the substrate; connecting the first set of trenches and the second set of trenches via the first set of TSVs.

A third aspect of the disclosure provides a design structure tangibly embodied in a machine readable medium for design, manufacturing, or testing a semiconductor device, the design structure including: a substrate; a first set of trenches formed in a first surface of the substrate; a second set of trenches formed in a second surface of the substrate; and at least one through silicon via connecting the first set of trenches and the second set of trenches.

BRIEF DESCRIPTION OF THE DRAWINGS

The above and other aspects, features and advantages of the disclosure will be better understood by reading the following more particular description of the disclosure in conjunction with the accompanying drawings.

Figure 1:
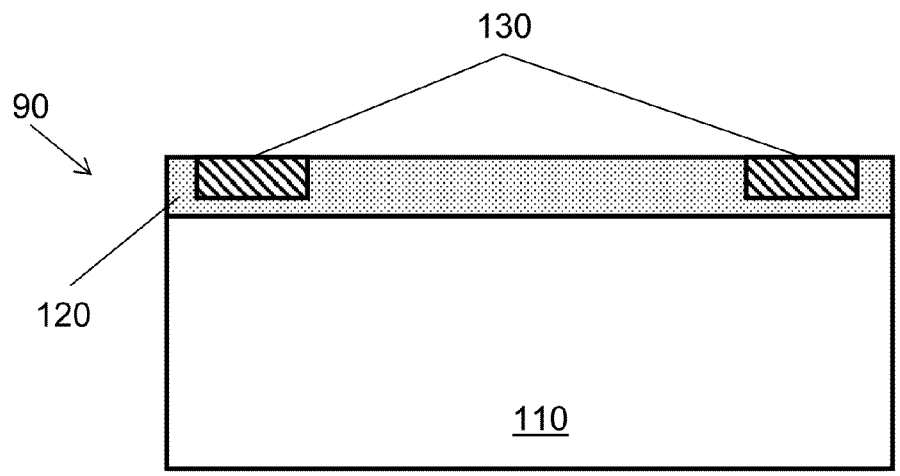
FIG. 1 shows a cross-sectional side view of portions of an integrated circuit.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

Turning to the drawings, FIG. 1 shows a cross-sectional side view of portions of an integrated circuit (IC) 90 including a set of back end of line (BEOL) elements 130. IC 90 includes a substrate 110 (e.g., wafer) upon which a series of back end of line (BEOL) processes may be performed, including deposition of a dielectric layer 120 and set of BEOL elements 130. Dielectric layer 120 may be comprised of, for example, a silicon oxide and/or a hafnium oxide. In one embodiment, set of BEOL elements 130 may be formed and/or installed in dielectric layer 120 as part of the BEOL processes. In one embodiment, BEOL elements 130 may include an inductor and/or a transformer. A person skilled in the art will readily recognize that location of set of BEOL elements 130 may be adjusted or modified to meet design and/or performance needs. Further, it is understood that other structures have been omitted for clarity. The omitted structures may include any conventional interconnect components, passive devices, etc. It is understood that front end of line (FEOL) processing generally refers to a portion of the manufacturing process in which individual components and devices are patterned in substrate 110, and that BEOL generally refers to a portion of the manufacturing process in which components and devices on substrate 110 are interconnected via wiring, metallization etc.

Substrate 110 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 110 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110, as illustrated and described, are well known in the art and thus, no further description is necessary.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
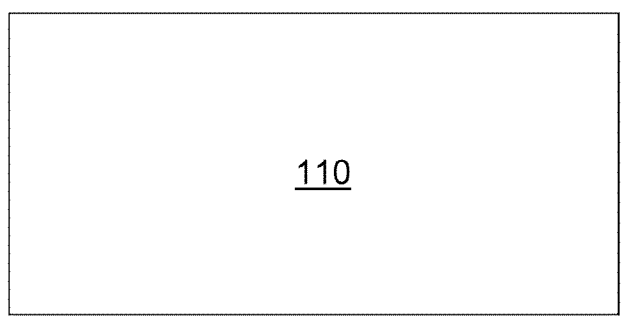
FIGS. 2-4, show cross-sectional views illustrating a method of forming portions of an integrated circuit.
Figure 3:
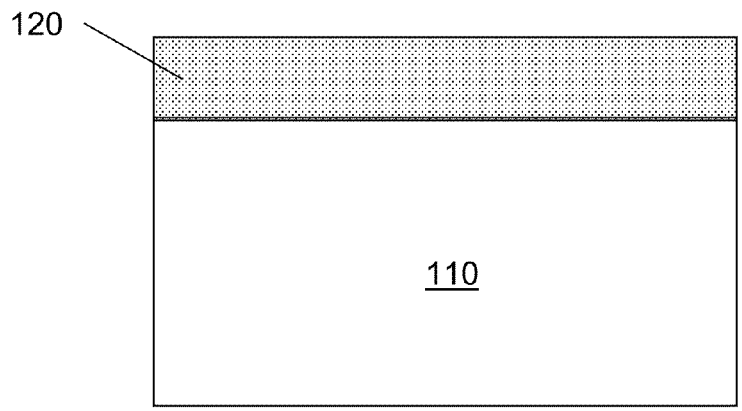
Figure 4:
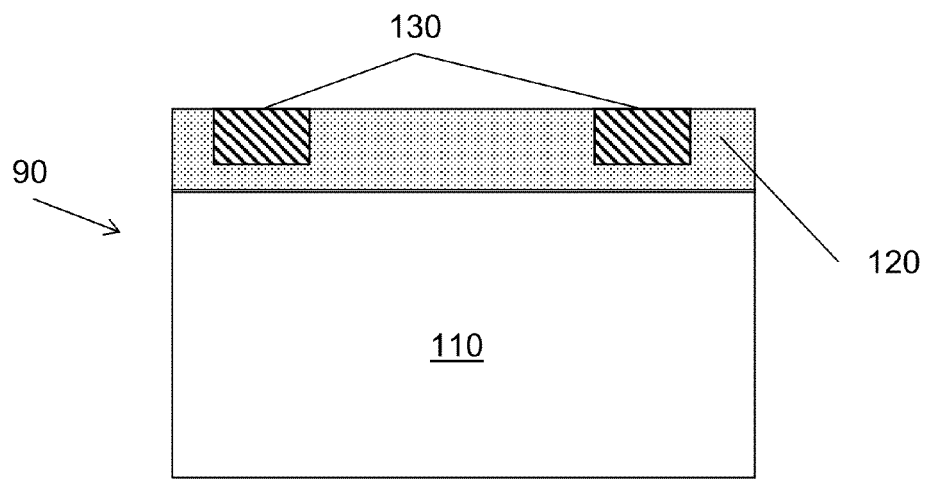

Turning to FIGS. 2-4, cross-sectional views illustrating a process in forming an IC 90 (shown in FIG. 4) with set of BEOL elements 130 in accordance with known methods is shown. FIG. 2 shows formation of a substrate 110 upon which BEOL processes are to be performed, thereby forming IC 90. The BEOL processes may include photoresist technique, etching or any other known or to be developed techniques.

In FIG. 3, a dielectric layer 120 is deposited on substrate 110. Dielectric layer 120 may include silicon dioxide ($SiO_2$), silicon nitride (SiN), or any other suitable material. Any number of dielectric layers may be located over the IC/chip body, as many other layers included in semiconductor chips now known or later developed. In one embodiment, dielectric layer 120 may include silicon dioxide ($SiO_2$) for its insulating, mechanical and optical qualities. Dielectric layer 120 may include, but is not limited to: silicon nitride ($Si_3N_4$), fluorinated $SiO_2$ (FSG), hydrogenated silicon oxycarbide (Si-COH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric layer 120 may be deposited using conventional techniques described herein and/or those known in the art.

Turning to FIG. 4, set of BEOL elements 130 are formed or deposited upon dielectric layer 120 and/or substrate 110, forming IC 90. Set of BEOL elements 130 may increase the inductance passives and impedance matching in IC 90, thereby attaining design values.

Figure 5:
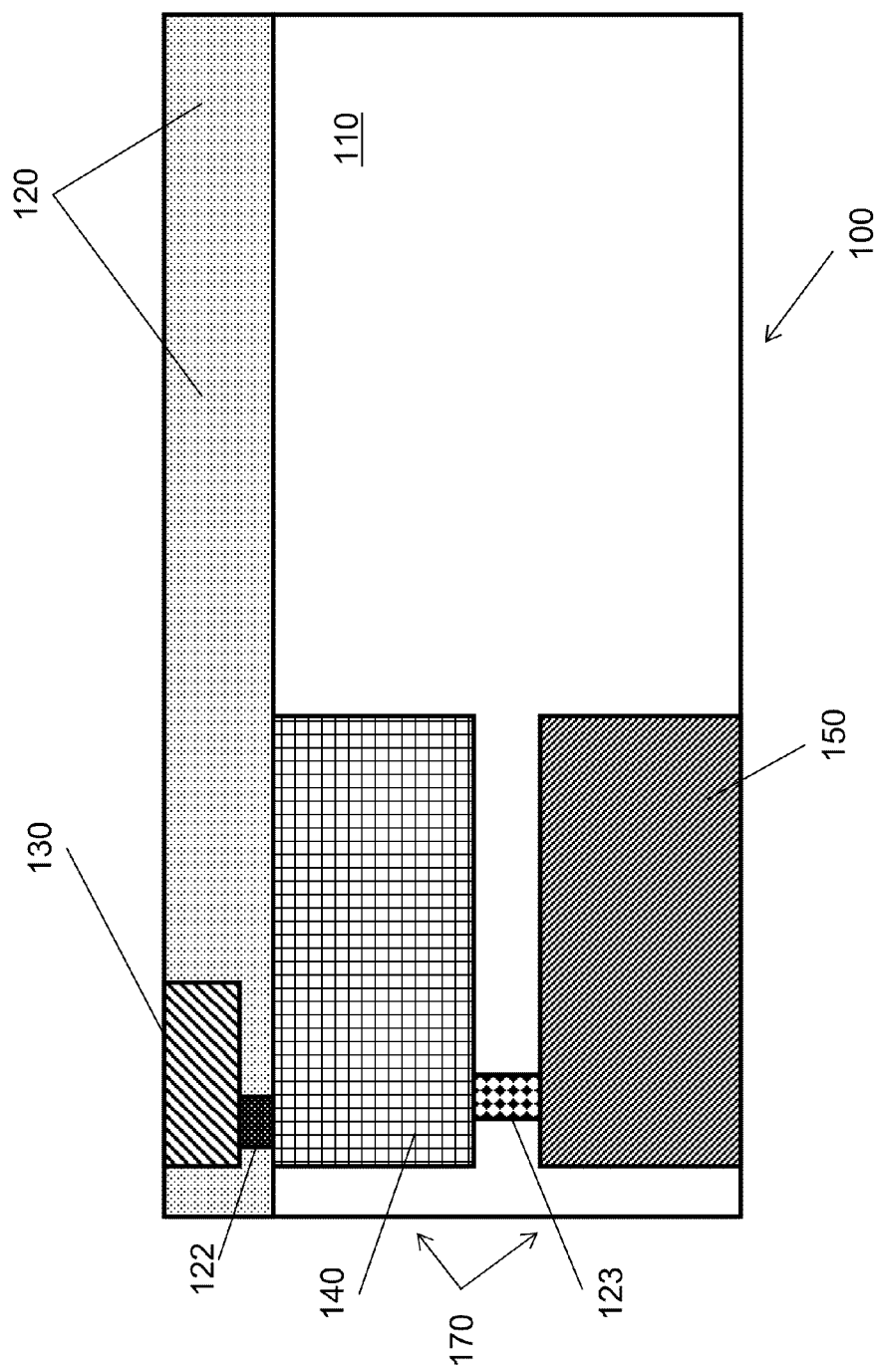
FIG. 5 shows a cross-sectional side view of portions of an integrated circuit according to embodiments of the invention.

Referring to FIG. 5, a cross-sectional side view of portions of an integrated circuit (IC) 100 according to embodiments of the invention is shown. IC 100 includes a back end of line (BEOL) element 130, and a substrate 110 including a first set of trenches 140 and a second set of trenches 150. First set of trenches 140 and second set of trenches 150 may be formed in substrate 110 by etching or any other means as is known in the art. Further, first set of trenches 140 and second set of trenches 150 may be oriented, formed or etched in any pattern now known or later developed. A person skilled in the art will readily recognize that location and orientation of first set of trenches 140 and/or second set of trenches 150 may be adjusted or modified to meet design and/or performance needs, and may be filled in as part of a metallization process. In one embodiment, material may be deposited in first set of trenches 140 and second set of trenches 150 to form a first inductor and a second inductor. In another embodiment, first set of trenches 140 and second set of trenches 150 may be filled with material in a pattern to form a first inductor and a second inductor. In one embodiment, first set of trenches 140 and second set of trenches 150 may be connected via a first set of through silicon vias (TSVs) 123, forming a transformer 170 in substrate 110. In one embodiment, set of TSVs 123 may be oriented so as to interconnect first set of trenches 140 and second set of trenches 150 to form a lateral inductor 117 (shown in FIG. 15) with increased length. In one embodiment, a dielectric layer 120 may be deposited upon substrate 110 after the formation of first set of trenches 140. Dielectric layer 120 may include BEOL element 130. In one embodiment, BEOL element 130 may include an inductor and/or a transformer. BEOL element 130 may connect to first set of trenches 140 and/or second set of trenches 150 via a second through silicon via (TSV) 122, thereby forming a transformer and/or a multi-layered transformer.

It is understood that deposition in the trenches may be accomplished thru any method discussed herein or known, including CVD, PVD, Electrochemical plating, and combinations there of Further, the materials included in this deposition may include but are not limited to W, Cu, Ta, TaN, Ti, TiN, Al, and combinations of these and other conductive materials.

Figure 6:
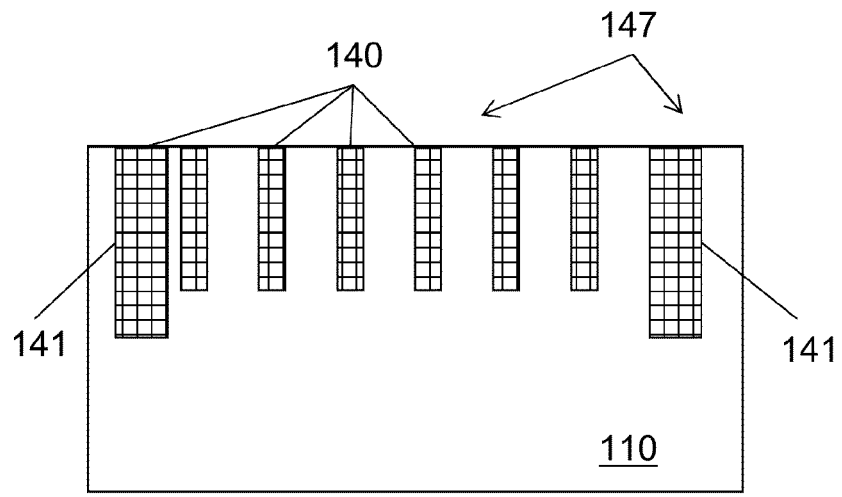
FIGS. 6-9, show cross-sectional views illustrating a method of forming portions of an integrated circuit according to embodiments of the invention.

Turning to FIGS. 6-9, cross-sectional views illustrating a process in forming an IC 100 (shown in FIG. 9) with a first set of trenches 140 and a second set of trenches 150 is illustrated according to embodiments of the invention. In FIG. 6, first set of trenches 140 may be formed in substrate 110 via etching or any other known means. In one embodiment, individual trenches within first set of trenches 140 may have varying depths and/or widths with respect to one another. In one embodiment, a depth of first set of trenches 140 may be controlled by regulating a width of each trench in set of trenches 140 (e.g., as the width of a given trench is increased the depth may also increase).

In another embodiment, etching of substrate 110 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include O2 (oxygen), a dilutant, and one or more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

In any event, first set of trenches 140 may be etched into a first surface 147 of substrate 110. In one embodiment, first set of trenches 140 may include a first set of TSV trenches 141. First set of TSV trenches 141 may have a width which is larger than a width of other trenches in first set of trenches 140, thereby increasing a depth of first set of TSV trenches 141 relative to other trenches in first set of trenches 140.

Figure 7:
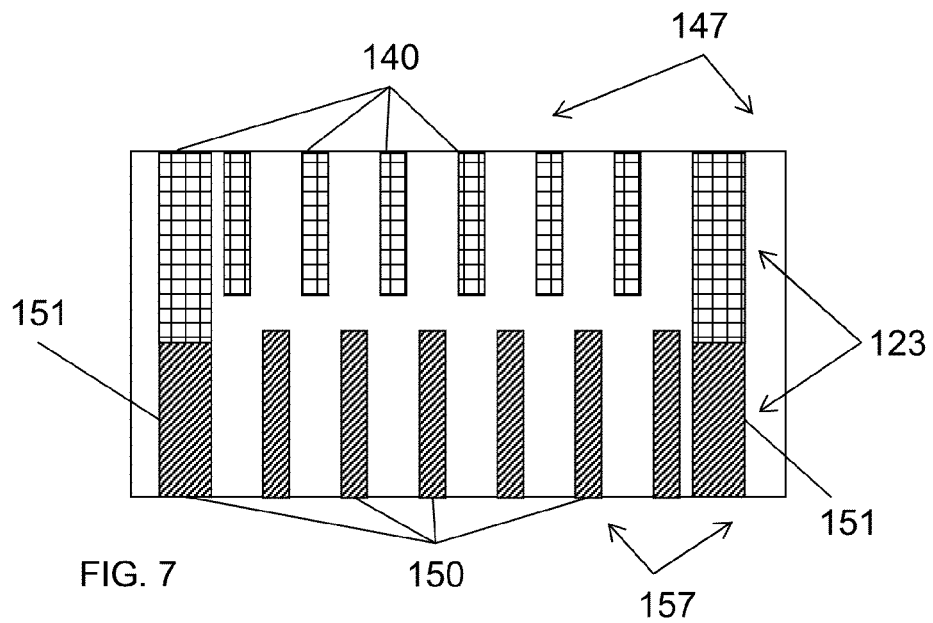

Turning to FIG. 7, a cross-sectional side view of forming a second set of trenches 150 in substrate 110 is shown according to embodiments of the invention. In one embodiment, second set of trenches 150 may be etched into a second surface 157 of substrate 110. In one embodiment, second surface 157 and first surface 147 may be located on opposing faces/sides of substrate 110. In one embodiment, second set of trenches 150 may be etched in substrate 110 after first set of trenches 140 have been etched. In one embodiment, substrate 110 may be flipped such that second set of trenches 150 may be etched. In one embodiment, second set of trenches 150 may be etched before any BEOL processing. In another embodiment, second set of trenches 150 may be etched in substrate 110 after some BEOL processing. In one embodiment, second set of trenches 150 may be oriented to align with first set of trenches 140. In another embodiment, second set of trenches 150 may be oriented to interleave and/or interweave with first set of trenches 140. In one embodiment, second set of trenches 150 may include a second set of TSV trenches 151 which are oriented to align with first set of TSV trenches 141. In one embodiment, second set of TSV trenches 151 may have a width greater than other trenches in second set of trenches 150. The etching of first set of TSV trenches 141 and second set of TSV trenches 151 forms first set of through silicon vias (TSVs) 123 through substrate 110, thereby connecting portions of first set of trenches 140 and portions of second set of trenches 150. It is understood that IC 100 may be subjected to a single or multiple metallization processes at any time during formation.

Figure 8:
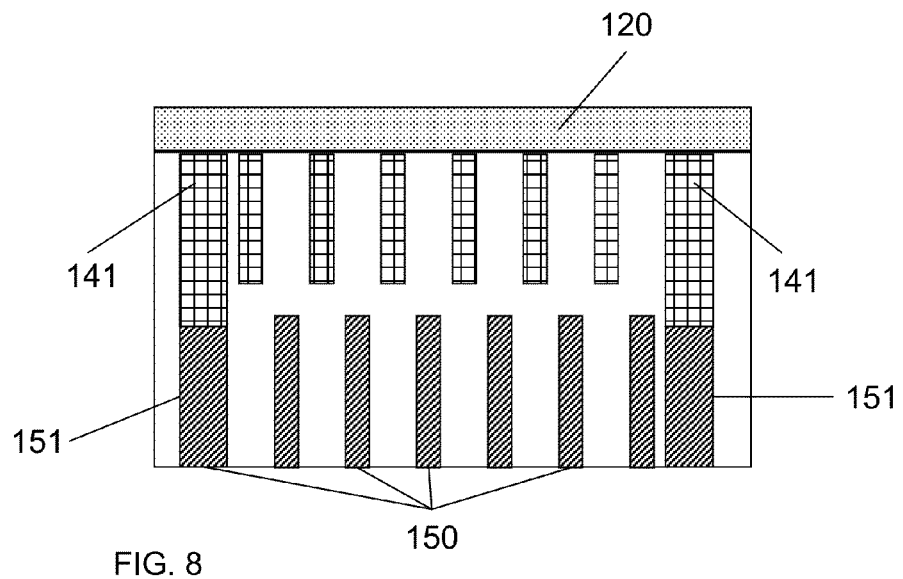
Figure 9:
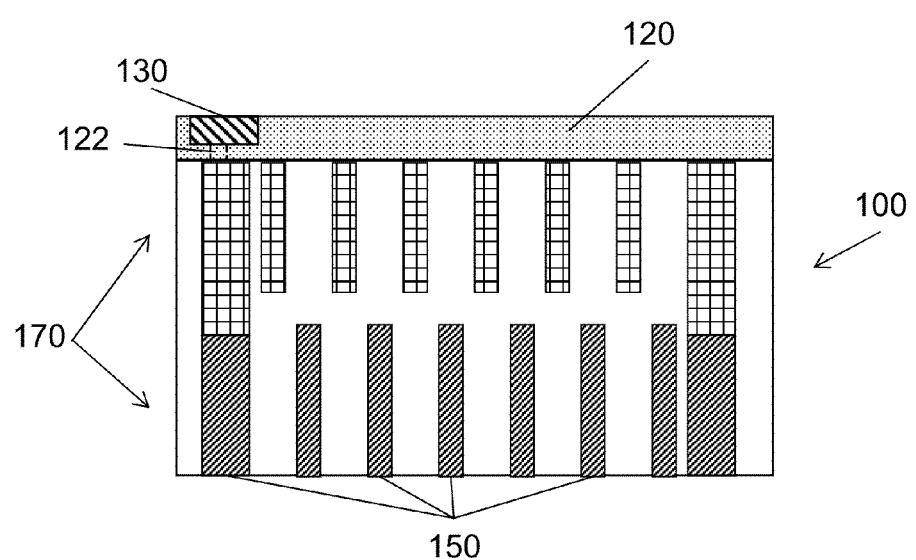

Turning to FIG. 8, a cross-sectional side view of one embodiment of depositing a dielectric layer 120 on substrate 110 is shown according to embodiments of the invention. It is understood that dielectric layer 120 may be deposited on substrate 110 either before or after second set of trenches 150 has been etched in substrate 110. Referring to FIG. 9, a cross-sectional side view of one embodiment of depositing a BEOL element 130 on dielectric layer 120 is shown. In one embodiment, BEOL element 130 may include an inductor. In another embodiment, BEOL element 130 may include a transformer. In one embodiment, BEOL element 130 may be connected to either or both of first set of trenches 140 and second set of trenches 150 via a second set of through silicon vias 122. In one embodiment, the connection of BEOL element 130 to either or both of first set of trenches 140 and second set of trenches 150 forms transformer 170. In another embodiment, the connection of first set of trenches 140 and second set of trenches 150 forms transformer 170.

Figure 10:
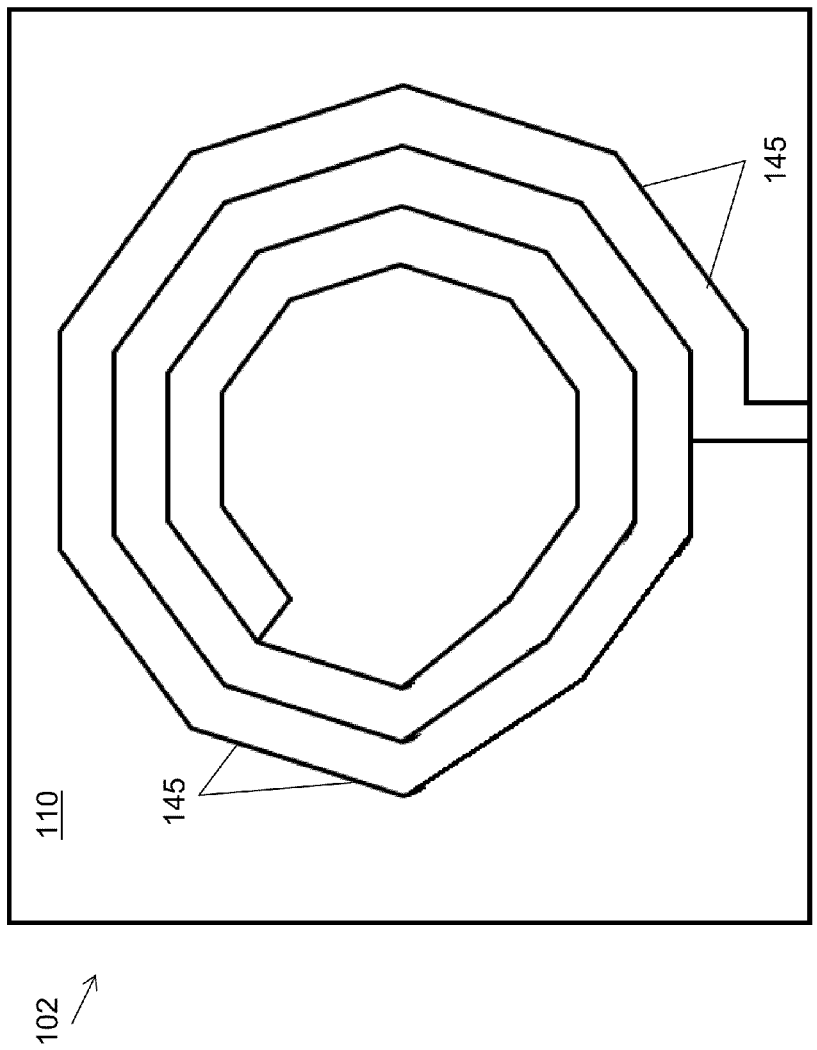
FIG. 10 shows a cross-sectional top view of portions of an integrated circuit according to embodiments of the invention.

Referring to FIG. 10, a cross sectional top view of one embodiment of an integrated circuit (IC) 102 is shown in accordance with embodiments of the invention. In this embodiment, a set of trenches 145 are formed in substrate 110 in a spiral pattern. Set of trenches 145 spiral about substrate 110, forming an inductor in substrate 110 with increased length relative to a standard substrate inductor, thereby increasing inductance properties of IC 102 relative to a standard IC.

Figure 11:
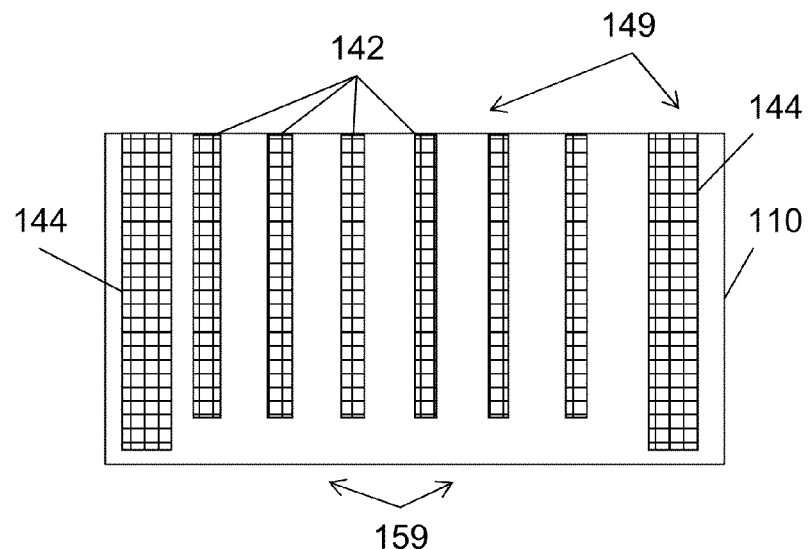
FIGS. 11-14, show cross sectional views illustrating a method of forming portions of an integrated circuit according to embodiments of the invention.

Turning to FIGS. 11-14, cross-sectional side views illustrating processes of forming a first set of trenches 142 and a second set of trenches 152 in portions of an IC 107 (shown in FIG. 14) according to embodiments of the invention are shown. In FIG. 11, first set of trenches 142 may be formed in substrate 110 via etching or any other known means. In one embodiment, individual trenches within first set of trenches 142 may have varying depths and/or widths with respect to one another. In one embodiment, a depth of first set of trenches 142 may be controlled by regulating a width of each trench in set of trenches 142 (e.g., as the width of a given trench is increased the depth may also increase). In one embodiment, first set of trenches 142 may be etched into a first surface 149 of substrate 110. In one embodiment, first set of trenches 142 may include a first set of TSV trenches 144. First set of TSV trenches 144 may have a width which is greater than a width of the other trenches in first set of trenches 142, thereby increasing a depth of first set of TSV trenches 144 in substrate 110 relative to other trenches in first set of trenches 142.

Figure 12:
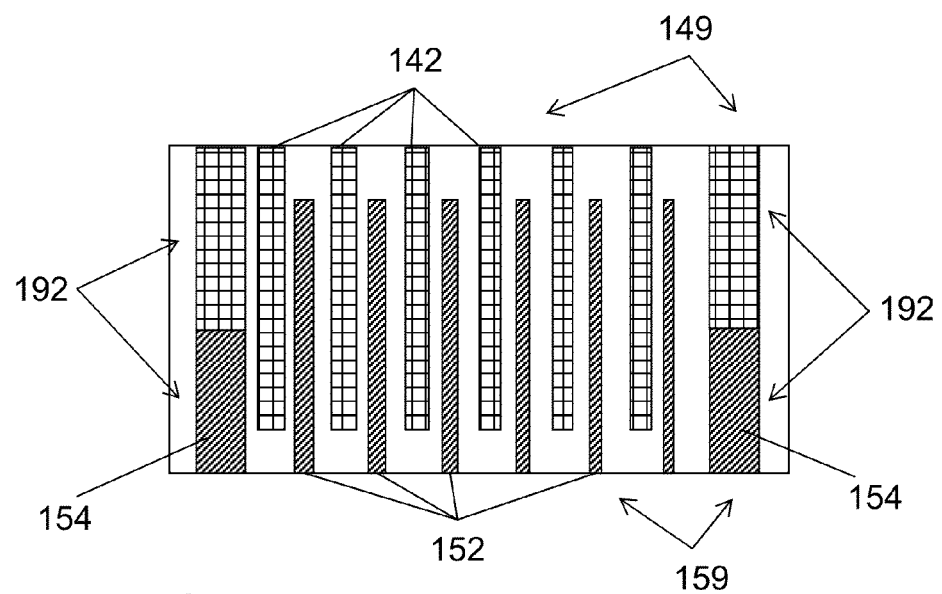
Figure 13:
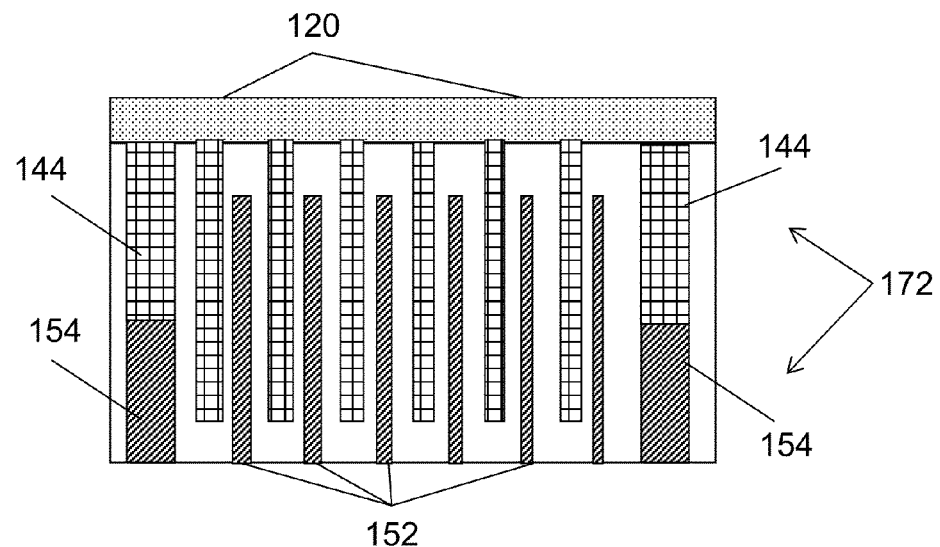

Turning to FIG. 12, a cross-sectional side view of one embodiment of forming a second set of trenches 152 in substrate 110 is shown according to embodiments of the invention. In one embodiment, second set of trenches 152 may be etched into a second surface 159 of substrate 110. In one embodiment, second surface 159 and first surface 149 may be located on opposing faces of substrate 110. In one embodiment, second set of trenches 152 may be etched in substrate 110 after first set of trenches 142 have been etched. In one embodiment, second set of trenches 152 may be etched before any BEOL processing. In another embodiment, second set of trenches 152 may be etched in substrate 110 after BEOL processing. In one embodiment, second set of trenches 152 may be etched into substrate 110 with a depth which overlaps with a depth of first set of trenches 142. In one embodiment, first set of trenches 142 and second set of trenches 152 may be oriented to be substantially interleaved and/or interwoven in substrate 110. In one embodiment, a second set of TSV trenches 154 may be included in second set of trenches 152. In one embodiment, second set of TSV trenches 154 may be oriented to align with first set of TSV trenches 144. In one embodiment, second set of TSV trenches 154 may have a width greater than other trenches in second set of trenches 154. The etching of TSV trenches 144 and 154 forms a set of through silicon vias (TSVs) 192 through substrate 110, thereby connecting portions of first set of trenches 142 and portions of second set of trenches 152. Metallization of first set of trenches 142, second set of trenches 152, first set of TSV trenches 144 and second set of trenches 154 may form a transformer 172 (shown in FIG. 13). Referring to FIG. 13, a cross-sectional side view of one embodiment of depositing dielectric layer 120 on substrate 110 is shown according to embodiments of the invention. It is understood that dielectric layer 120 may be deposited on substrate 110 either before or after second set of trenches 152 has been etched in substrate 110.

Figure 14:
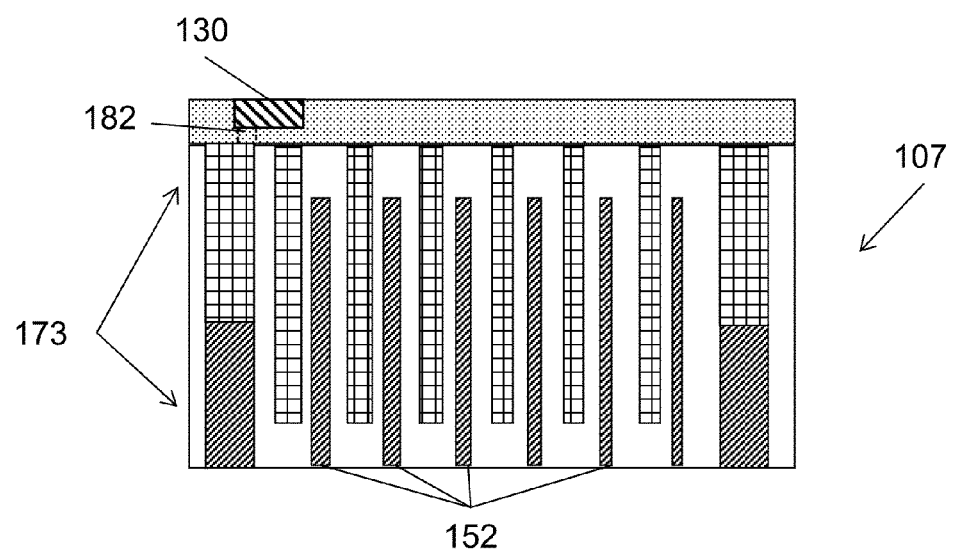

Turning to FIG. 14, a cross-sectional side view of one embodiment of depositing a BEOL element 130 on dielectric layer 120 is shown according to embodiments of the invention. In one embodiment, BEOL element 130 may include an inductor. In another embodiment, BEOL element 130 may include a transformer. In one embodiment, BEOL element 130 may be connected to either or both of first set of trenches 142 and second set of trenches 152 via a set of through silicon vias 182 (shown in phantom). The connection of BEOL element 130 to either or both of first set of trenches 142 and second set of trenches 152 forms a multi-level transformer 173.

Figure 15:
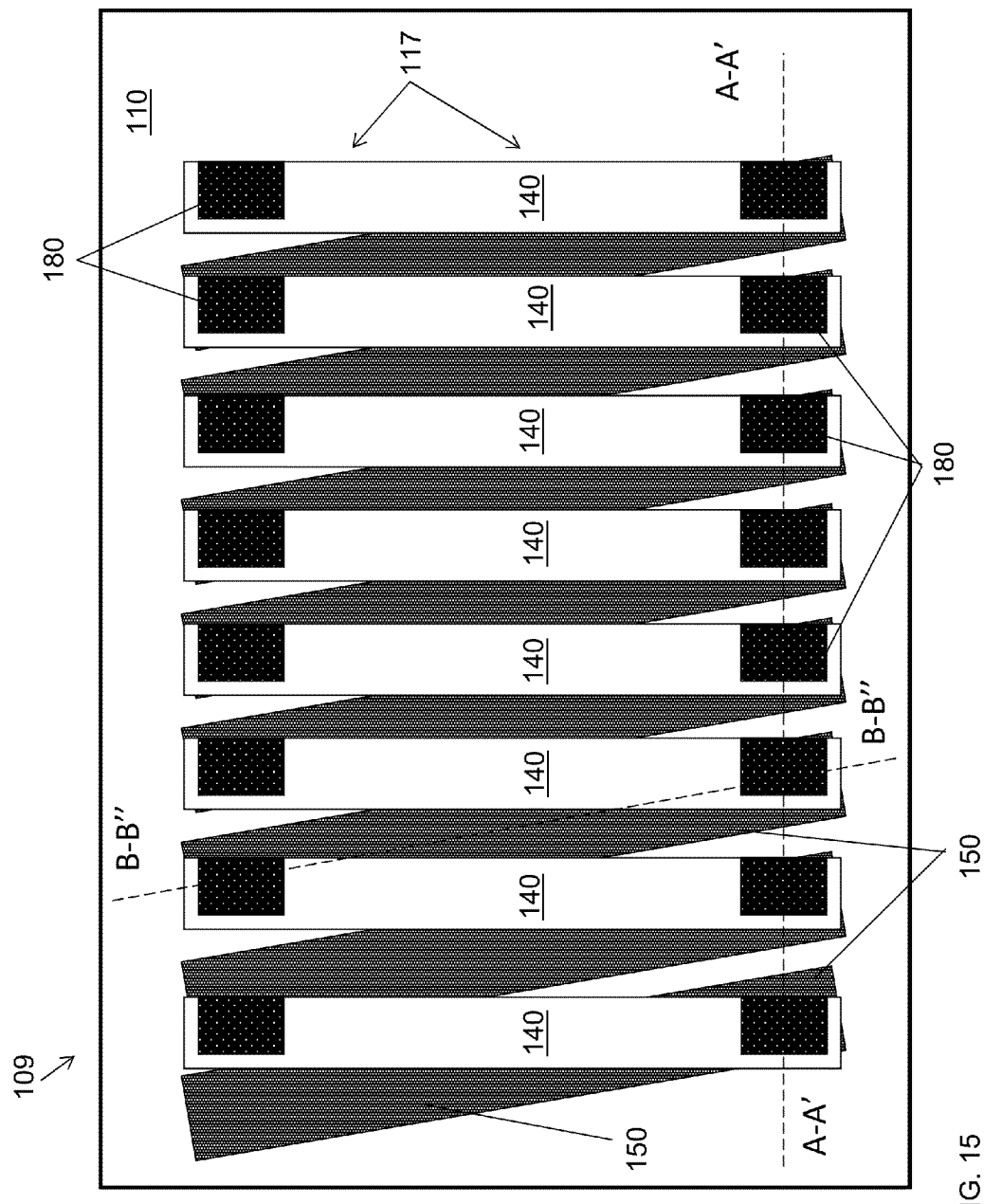
FIG. 15 shows a cross-sectional top view of portions of an integrated circuit according to embodiments of the invention.
Figure 16:
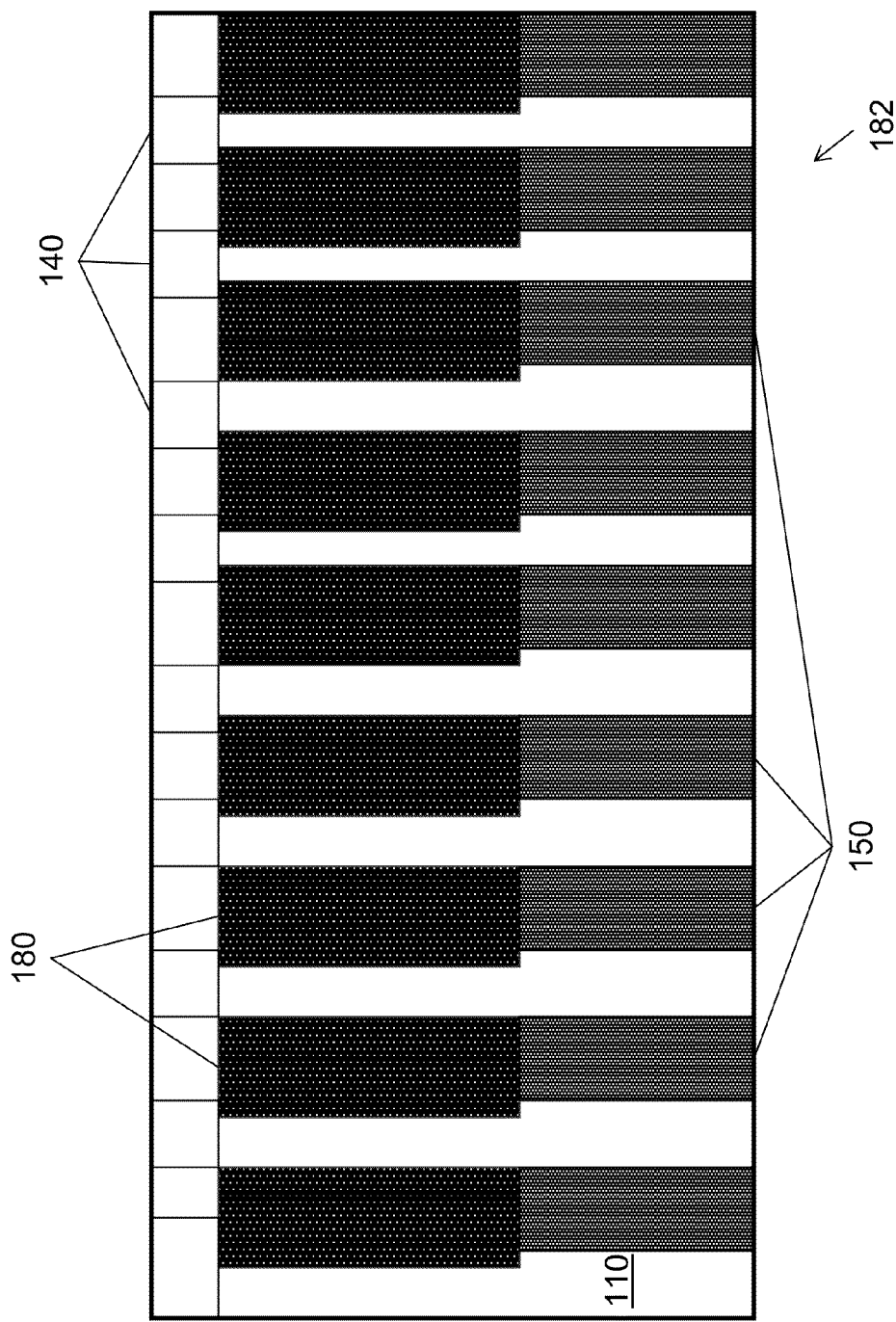
FIG. 16 shows a cross sectional view of the integrated circuit of FIG. 15 along view line A-A.
Figure 17:
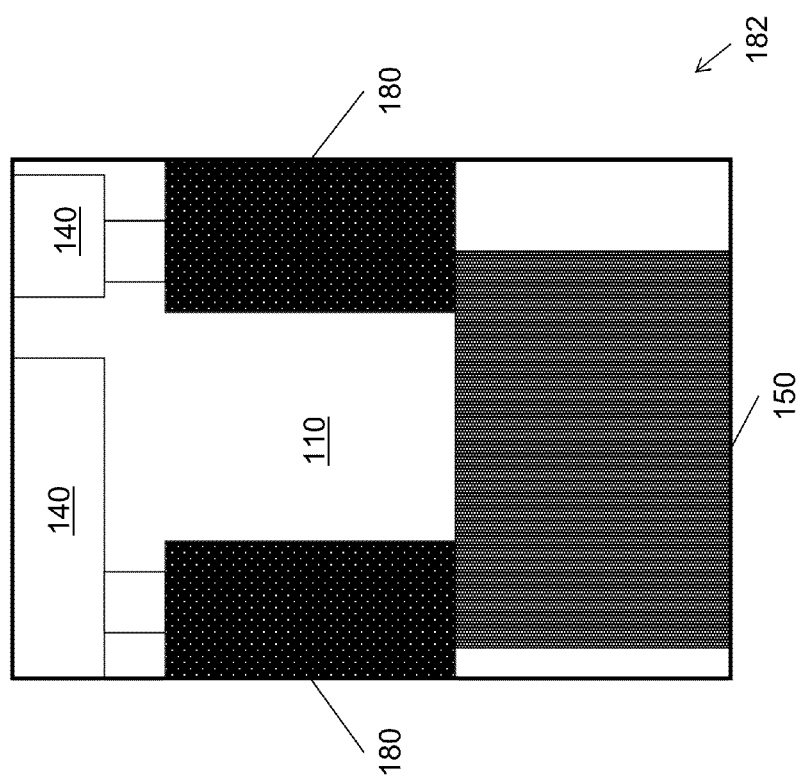
FIG. 17 shows a cross sectional view of the integrated circuit of FIG. 15 along view line B-B.

Turning to FIGS. 15-17, embodiments of portions of a wafer and integrated circuit (IC) 109 are shown in accordance with embodiments of the disclosure. FIG. 15 shows a top view of portions of IC 109. FIG. 16 shows a cross-sectional view of portions of IC 109 along line A-A in FIG. 15, and FIG. 17 shows a cross-sectional view of portions of IC 109 along line B-B in FIG. 15.

Referring to FIG. 15, a cross sectional top view of one alternative embodiment of IC 109 in accordance with this invention is shown. In this embodiment, first set of trenches 140 and second set of trenches 150 are formed in substrate 110 and oriented in a skewed/angled configuration relative one another, with first set of trenches 140 being oriented at an angle relative to second set of trenches 150. The skewed configuration results in at least one trench from first set of trenches 140 overlapping with portions of two separate trenches in second set of trenches 150. Similarly, the skewed configuration results in at least one trench from second set of trenches 150 overlapping with portions of two separate trenches in first set of trenches 140. In this embodiment, distal ends of first set of trenches 140 overlap with distal ends of second set of trenches 150. The distal ends of first set of trenches 140 and the distal ends of second set of trenches 150 are connected via a set of through silicon vias (TSVs) 180, forming a lateral inductor 117 with increased length. In this embodiment, plurality of TSVs 180 and the skewed configuration of second set of trenches 150 connect adjoining trenches in first set of trenches 140. It is understood that TSVs 180 may be formed via any now known or later developed techniques including etching or the overlapping trench method described herein.

As shown in FIGS. 16-17, first set of trenches 140 may be connected to second set of trenches 150 via set of TSVs 180, thereby forming a continuous trench through substrate 110. In one embodiment, substrate 110 may be subjected to a metallization process, thereby forming lateral inductor 117 which includes first set of trenches 140, second set of trenches 150 and set of TSVs 180.

Figure 18:
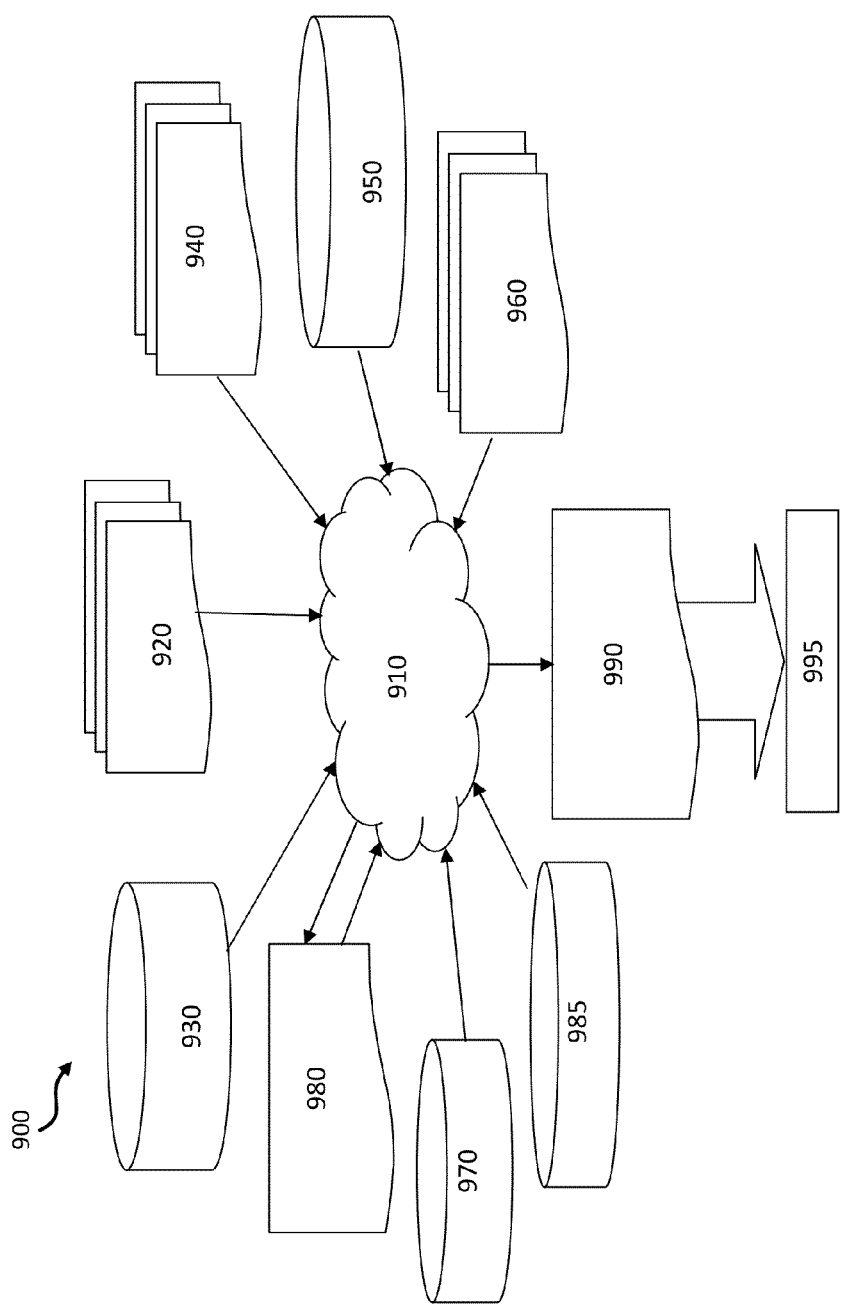
FIG. 18 is a flow diagram of a design process used in semiconductor design, manufacture, and/or test according to embodiments of the invention.

FIG. 18 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-17. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 18 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-17 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 990 may comprise a compiled, executable HDL simulation model that functionally simulates the devices shown in FIGS. 1-17.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both sursurface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor device comprising:
    a substrate;
    a first set of trenches formed in a first surface of the substrate, a first trench of the first set of trenches extending to a first depth within the substrate;
    a second set of trenches formed in a second surface of the substrate opposite the first surface, a second trench of the second set of trenches disposed laterally adjacent the first trench and extending to a second depth within the substrate, the second depth extending beyond the first depth; and
    a third trench of the first set of trenches extending to a third depth within the substrate to meet a fourth trench of the second set of trenches extending to a fourth depth within the substrate, thereby forming a through silicon via connecting the first set of trenches and the second set of trenches.

2. The semiconductor device of claim 1, wherein the first set of trenches are filled with a material forming a first inductor and the second set of trenches are filled with the material forming a second inductor.

3. The semiconductor device of claim 2, wherein the first inductor and the second inductor are connected via the through silicon via to form a transformer.

4. The semiconductor device of claim 1, wherein the first set of trenches and the second set of trenches are interleaved in the substrate.

5. The semiconductor device of claim 2, further comprising a back end of line (BEOL) inductor connected to at least one of the first inductor and the second inductor.

6. The semiconductor device of claim 1, wherein the first set of trenches and the second set of trenches are connected by a plurality of through silicon vias to form a lateral inductor.

7. The semiconductor device of claim 6, further comprising a back end of line (BEOL) inductor connected to the lateral inductor to form a transformer.

8. A method, comprising:
forming a first set of trenches in a first surface a substrate, a first trench of the first set of trenches extending to a first depth within the substrate;
performing back end of line (BEOL) processing;
forming a second set of trenches in a second surface the substrate opposite the first surface, a second trench of the second set of trenches disposed laterally adjacent the first trench and extending to a second depth within the substrate, the second depth extending beyond the first depth;
extending at least one trench of the second set of trenches to meet at least one trench of the second set of trenches, thereby forming a through silicon via connecting the first set of trenches and the second set of trenches.

9. The method of claim 8, wherein a depth of the through silicon via is controlled by regulating a width of the through silicon via.

10. The method of claim 8, further comprising reducing a thickness of the substrate.

11. The method of claim 8, further comprising:
connecting a BEOL inductor to the substrate, the BEOL inductor connected to the first set of trenches and the second set of trenches to form a transformer.

12. A design structure tangibly embodied in a machine readable medium for design, manufacturing, or testing a semiconductor device, the design structure comprising:
a substrate;
a first set of trenches formed in a first surface of the substrate, a first trench of the first set of trenches extending to a first depth within the substrate;
a second set of trenches formed in a second surface of the substrate opposite the first surface, a second trench of the second set of trenches disposed laterally adjacent the first trench and extending to a second depth within the substrate, the second depth extending beyond the first depth; and
a third trench of the first set of trenches extending to a third depth within the substrate to meet a fourth trench of the second set of trenches extending to a fourth depth within the substrate, thereby forming a through silicon via connecting the first set of trenches and the second set of trenches.

13. The design structure of claim 12, wherein the first set of trenches forms a first inductor and the second set of trenches forms a second inductor.

14. The semiconductor device of claim 13, wherein the first inductor and the second inductor are connected via the through silicon via to form a transformer.

15. The design structure of claim 14, wherein the first surface of the substrate and the second surface of the substrate are oriented parallel one another.

16. The design structure of claim 15, wherein the first set of trenches and the second set of trenches are interleaved in the substrate.

17. The design structure of claim 13, further comprising a back end of line (BEOL) inductor connected to at least one of the first inductor and the second inductor.

18. The design structure of claim 12, wherein the first set of trenches and the second set of trenches are connected by a plurality of through silicon vias to form a lateral inductor.

19. The design structure of claim 17, further comprising a back end of line (BEOL) inductor connected to the lateral inductor to form a transformer.

* * * * *